(12) United States Patent
Watanabe et al.

(10) Patent No.: US 7,023,481 B1
(45) Date of Patent: Apr. 4, 2006

(54) SOLID STATE IMAGING DEVICE FOR ALLEVIATING THE EFFECT OF BACKGROUND LIGHT AND IMAGING APPARATUS INCLUDING SAME

(75) Inventors: Kunihiro Watanabe, Kyoto (JP); Takeshi Yamamoto, Kyoto (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 759 days.

(21) Appl. No.: 09/715,629

(22) Filed: Nov. 18, 2000

(30) Foreign Application Priority Data

Nov. 18, 1999 (JP) ................................. 11-328400

(51) Int. Cl.
*H04N 5/335* (2006.01)
*H04N 3/14* (2006.01)

(52) U.S. Cl. ........................ 348/297; 348/319; 348/370

(58) Field of Classification Search ................ 348/297, 348/294, 316, 317, 312, 319, 320, 321, 322, 348/323, 370, 371, 296; 257/229, 240; 235/462.41; 396/106
See application file for complete search history.

(56) References Cited

U.S. PATENT DOCUMENTS

| | | | | |
|---|---|---|---|---|
| 3,940,602 A | * | 2/1976 | Lagnado et al. ............. | 708/820 |
| 4,336,557 A | * | 6/1982 | Koch .......................... | 348/302 |
| 4,490,036 A | * | 12/1984 | Anagnostopoulos ........ | 396/106 |
| 5,025,318 A | * | 6/1991 | Nagura ........................ | 348/316 |
| 5,153,731 A | * | 10/1992 | Nagasaki et al. ............ | 348/294 |
| 5,398,060 A | * | 3/1995 | Leacock et al. ............. | 348/241 |

(Continued)

FOREIGN PATENT DOCUMENTS

EP          0685813          12/1995

OTHER PUBLICATIONS

T. Spirig, P. Seitz, O. Vietze and F. Heitger, "The Lock-In CCD—Two-Dimensional Synchronous Detection of Light" 8106 IEEE Journal of Quantum Electronics, IEEE, Sep. 1, 1995, vol. 31, No. 9, pp. 1705-1708.

(Continued)

*Primary Examiner*—Aung Moe
(74) *Attorney, Agent, or Firm*—Katten Muchin Rosenman LLP

(57) ABSTRACT

In a solid state imaging apparatus of the present invention, first and second charge-coupled devices (CCDs) 336A and 336B are prepared as two charge accumulation circuits for one photodiode 330. The first and second CCDs 336A and 336B additionally accumulate charges during an on-state and an off-state of a light emitting source in the imaging apparatus, respectively. After the additional charge accumulation, the additionally accumulated charges in the first and second CCDs 336A and 336B are fed to first and second charge transfer CCD registers 333A and 333B, respectively. The charges in the first and second charge transfer CCD registers 333A and 333B are shifted in sequence to thereby output first and second charge signals, respectively. A differential amplifier 334 of the imaging apparatus calculates and outputs a differential signal between the first charge signal and the charge second signal. By using the imaging apparatus of the present invention, the effect, e.g., backlight and/or over exposure effect, due to background light inputted to the photodiode 330 with almost equal intensity during the on-state and the off-state thereof is removed to thereby obtain a clear image of a target subject formed corresponding to the radiation light from the light emitting source.

6 Claims, 14 Drawing Sheets

U.S. PATENT DOCUMENTS 5,585,652 A * 12/1996 Kamasz et al. .............. 257/231
5,587,576 A * 12/1996 Maki ..................... 235/462.41
5,917,546 A *  6/1999 Fukui ......................... 348/296
5,946,102 A    8/1999 Holcomb et al.
6,278,490 B1 *  8/2001 Fukuda et al. .............. 348/362

OTHER PUBLICATIONS

T. Spirig, P. Seitz and O. Vietze, "Smart CCD Image Sensors for Optical Metrology and Machine Vision" Advanced Technologies Intelligent Vision, IEEE, Oct. 6, 1995, pp. 11-14.

* cited by examiner

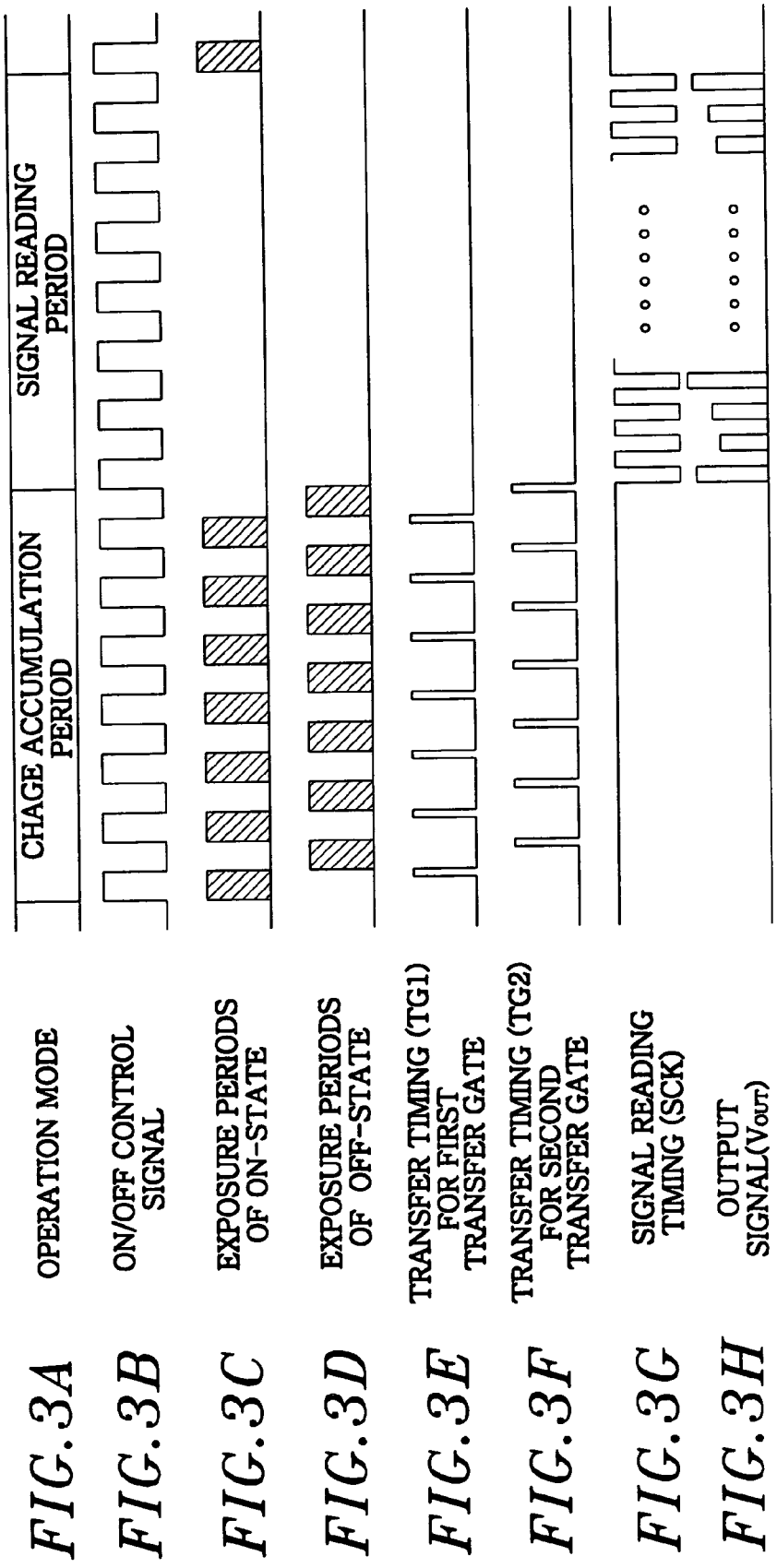

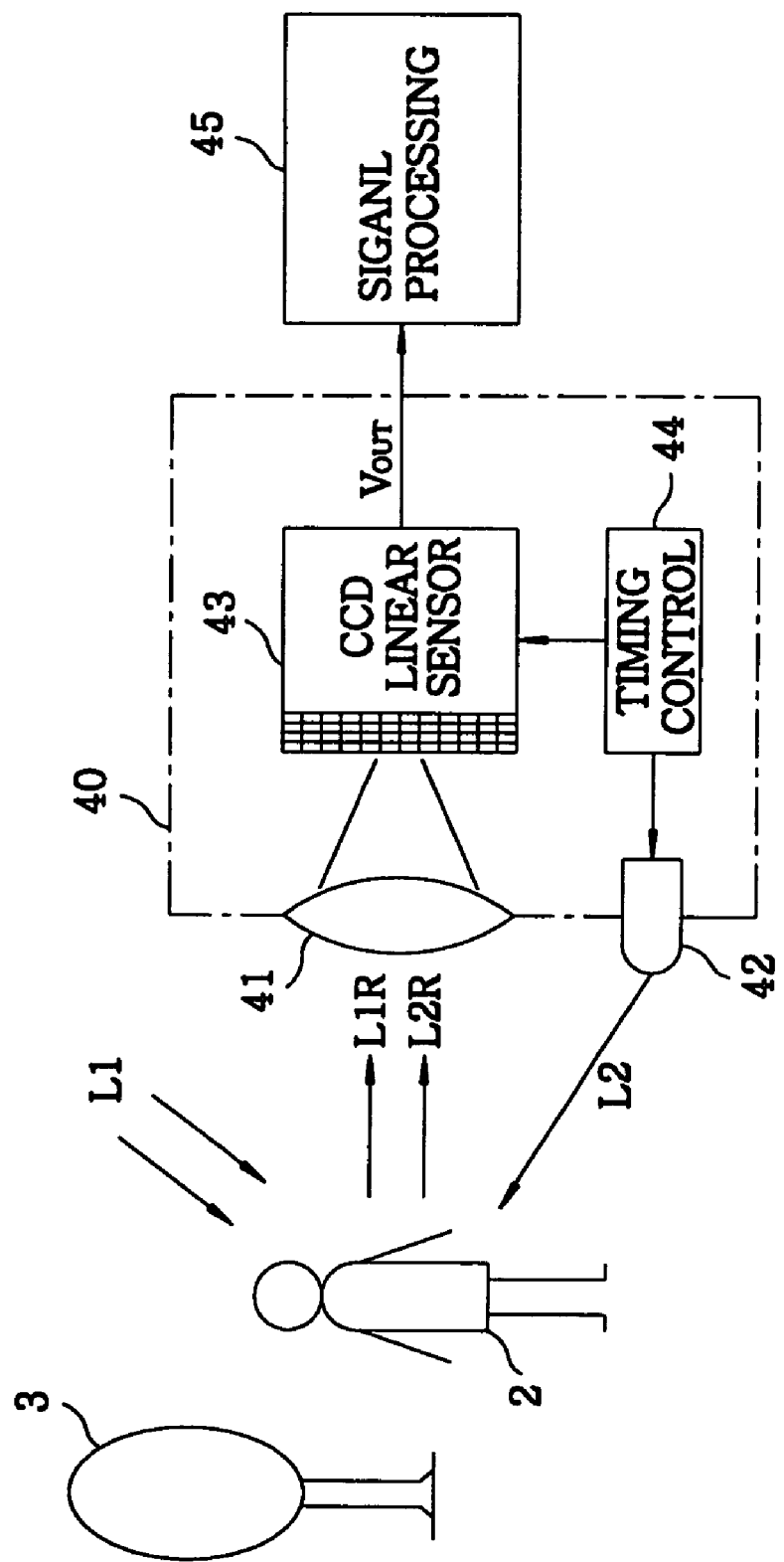

SOLID STATE IMAGING DEVICE FOR ALLEVIATING THE EFFECT OF BACKGROUND LIGHT AND IMAGING APPARATUS INCLUDING SAME

FIELD OF THE INVENTION

The present invention relates to a solid state imaging device and a solid state imaging apparatus including the former.

BACKGROUND OF THE INVENTION

Currently, a charge-coupled device (CCD) linear sensor and a CCD image sensor are the two most popular solid state imaging devices. Generally, in a conventional CCD sensor of an interline-transfer type, a plurality of photo diodes, as light receiving elements, are arranged horizontally and vertically; a vertical scanning CCD shift register is prepared adjacent to and parallel with a column of corresponding vertically arranged photo diodes; and a serial output from the vertical scanning CCD shift register is inputted to a CCD in a horizontal scanning CCD shift register.

Charges, i.e., photo-charges generated and accumulated in a process of photoelectric conversion by employing a photodiode, are transmitted to a corresponding adjacent vertical scanning CCD en bloc in response to a preset clock signal; and then the charges are progressively shift registered in a corresponding vertical scanning CCD shift register by a preset sequential clock signal. A serial charge output from the corresponding vertical scanning CCD shift register is fed to a horizontal scanning CCD shift register. The charges are progressively shift registered in the corresponding horizontal scanning CCD shift register in response to a preset sequential clock signal to thereby output a time series analog signal.

In this conventional solid state imaging apparatus, e.g., a digital camera, employing such a solid state imaging device, there is prepared an electric or mechanical shutter for controlling an input of incident light to the solid state imaging device, wherein only during the period while the shutter is opened, the incident light is irradiated on photodiodes in the solid state imaging device to thereby generate and accumulate charges. The incident light may include natural sunlight, light originated from a fluorescent or electric lamp and light reflected from a subject. The incident light may further include light reflected from a supplementary light source such as the one used in a stroboscope.

As is well known in the art, if the intensity of background light, e.g., due to natural sunlight, is too high, there may arise the so-called backlight phenomenon. In such event, an image for a subject becomes dark and unclear; and a boundary between a subject image and a background image becomes vague. In some cases, it is required that background image for a target subject be eliminated to obtain a clear image for the target subject.

An undesired background image for the target subject can be eliminated through an image processing procedure by employing a computer. However, if the boundary between an image of the target subject and a background image thereof is unclear, it is difficult to eliminate the background image properly.

SUMMARY OF THE INVENTION

It is, therefore, an object of the present invention to provide a solid state imaging device and a solid state imaging apparatus incorporating the device therein for alleviating or eliminating the effect of background light stemming from, e.g., sunlight and/or an artificial illumination, thereby allowing a user to capture a clear image of a target subject.

In accordance with one aspect of the present invention, there is provided a solid state imaging apparatus comprising:
  means for receiving an incident light to thereby generate charges, the receiving means having one or more photoelectric conversion elements;
  first accumulation means, in response to a first control signal, for accumulating the charges generated at each of the photoelectric conversion elements, the first accumulation means having one or more charge accumulation devices;
  second accumulation means, in response to a second control signal, for accumulating the received charges generated from each of the photoelectric conversion elements, the second accumulation means having one or more charge accumulation devices;
  first transfer means for transferring the charges accumulated in the first charge accumulation means in a serial sequence as a first charge signal;
  second transfer means for transferring the charges accumulated in the second charge accumulation means in a serial sequence as a second charge signal;
  means for emitting light onto a target subject, wherein the intensity of the emitting light is controllable;
  control means, based on a variation of the intensity of the emitted light, for outputting the first control signal or the second control signal to select the fist or the second charge accumulation means, thereby allowing the charges to be accumulated in the fist or the second charge accumulation means, respectively; and
  means for calculating a difference between the first charge signal and the second charge signal to thereby output a differential signal in sequence.

In accordance with another aspect of the present invention, there is provided a solid state imaging device for use in a solid state imaging apparatus, the device comprising:
  means for receiving an incident light to thereby generate charges, the receiving means having one or more photoelectric conversion elements;
  first accumulation means, in response to a first control signal, for accumulating the charges generated from each of the photoelectric conversion elements, the first accumulation means having one or more charge accumulation devices;
  second accumulation means, in response to a second control signal, for accumulating the received charges generated from each of the photoelectric conversion elements, the second accumulation means having one or more charge accumulation devices;
  first transfer means for transferring the charges accumulated in the first charge accumulation means in a serial sequence as a first charge signal;
  second transfer means for transferring charges accumulated in the second charge accumulation means in a serial sequence as a second charge signal;
  control means for outputting the first control signal or the second control signal to select the fist or the second charge accumulation means, thereby allowing the charges to be accumulated in the first or the second charge accumulation means, respectively; and
  means for calculating a difference between the first charge signal and the second charge signal to thereby output a differential signal in sequence.

BRIEF DESCRIPTION OF THE DRAWINGS

The above and other objects and features of the present invention will become apparent from the following description of preferred embodiments given with reference to the accompanying drawings, in which:

FIGS. 3A to 3H depict timing diagrams relating to the operation of the solid state imaging apparatus illustrated in FIG. 1;

FIG. 10 offers a diagram of a camera having the solid state imaging apparatus equipped with the CCD image sensor represented in FIG. 9;

DETAILED DESCRIPTION OF THE PREFERRED EMBODIMENTS

From now on, referring to FIGS. 1 to 15, solid state imaging devices and solid state imaging apparatuses in accordance with the preferred embodiments of the present invention will be described.

Figure 1:
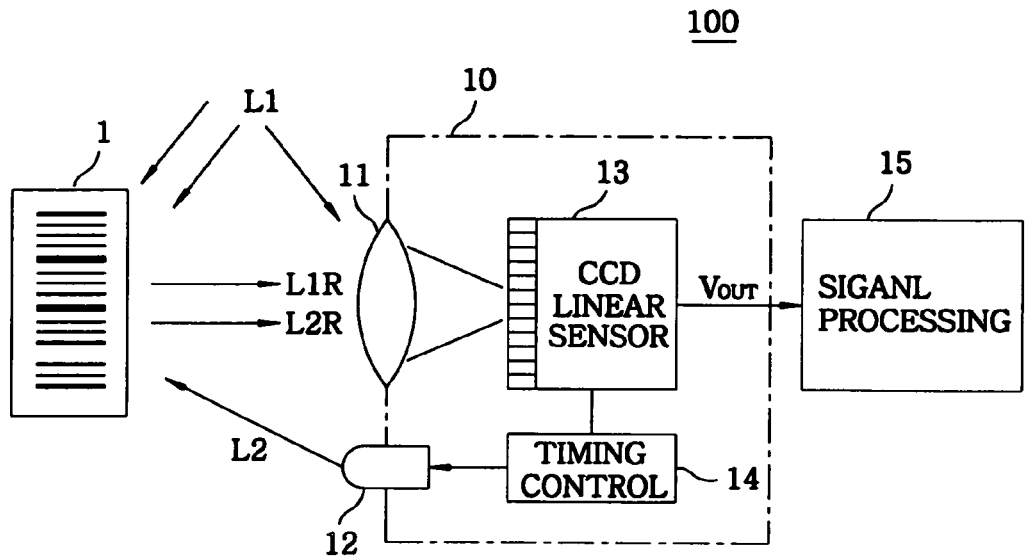
FIG. 1 illustrates a schematic diagram of a bar code reader employing a solid state imaging apparatus in accordance with a first preferred embodiment of the present invention.
Figure 2:
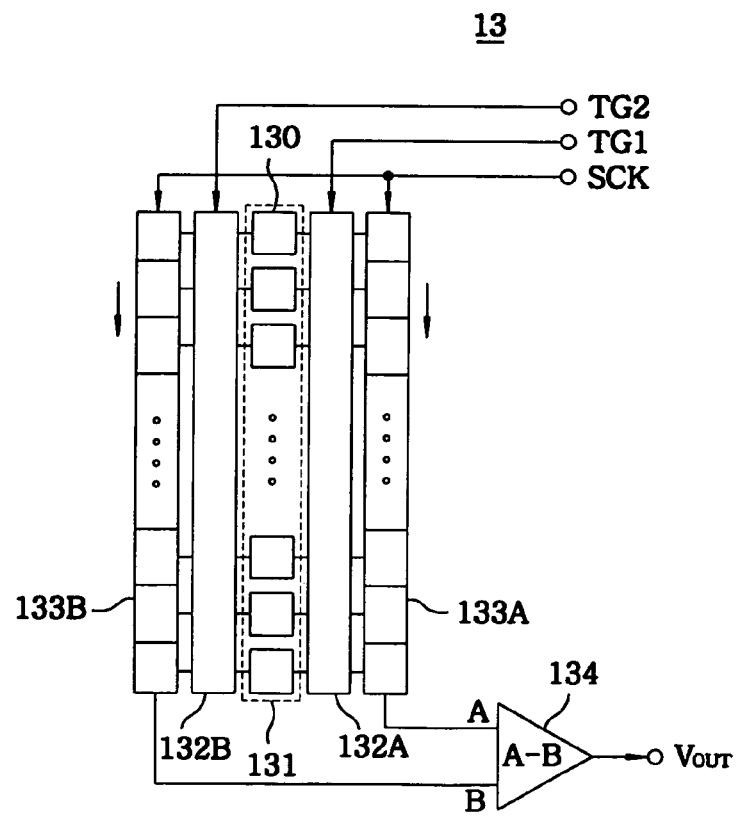
FIG. 2 shows a structural diagram of a charge-coupled device (CCD) linear sensor illustrated in FIG. 1.

FIG. 1 illustrates a schematic diagram of a bar code reader 100 employing a solid state imaging apparatus 10 in accordance with a first preferred embodiment of the present invention. FIG. 2 shows a structural diagram of a charge-coupled device (CCD) linear sensor 13 illustrated in FIG. 1.

As illustrated in FIG. 1, the bar code reader 100 is provided with the solid state imaging apparatus 10 and a signal processing circuit 15. The solid state imaging apparatus 10 includes a condensing lens system 11, a light emitting source 12 emitting supplementary light L2 onto a subject (bar code) 1, the CCD linear sensor 13 converting an optical signal into an electric signal and a timing control circuit 14 controlling the operation of the light emitting source 12 and the CCD linear sensor 13. Generally, a high speed on/off device, e.g., an LED, is employed as the light emitting source 12.

As shown in FIG. 2, the CCD linear sensor 13 has a light receiving circuit 131 having a plurality of linearly arranged photodiodes 130, a first CCD shift register 133A and a second CCD shift register 133B. Each of the CCD shift registers 133A and 133B acts as a charge accumulation circuit and a transfer circuit simultaneously. The CCD shift registers 133A and 133B are arranged at right and left adjacent locations to the light receiving circuit 131, respectively. A first transfer gate 132A and a second transfer gate 132B are provided between the light receiving circuit 131 and the first CCD shift register 133A and the second CCD shift register 133B, respectively. A differential amplifier 134 calculates and outputs a differential signal $V_{out}$ between a serial output (analog voltages) from the first CCD shift register 133A and that from the second CCD shift register 133B.

Each of the first CCD shift register 133A and the second CCD shift register 133B contains a plurality of vertically arranged CCDs. An output from one photodiode 130 in the light receiving circuit 131 is fed to a corresponding CCD in one of the first CCD shift register 133A and the second CCD shift register 133B through the first transfer gate 132A and the second transfer gate 132B, respectively.

In the light receiving circuit 131, there is installed an electric shutter (not shown in FIG. 2), wherein the light receiving circuit 131 is exposed to an incident light only during a period while the shutter is opened. In this case, the exposure time is controlled by an open-and-shut operation of the shutter. The shutting function corresponding to an electric shutter may also be achieved by eliminating accumulated charges in the light receiving circuit 131 just before the charge accumulation period thereof starts.

FIGS. 3A to 3H depict timing diagrams relating to the reading operation of the bar code reader 100 employing the solid state imaging apparatus 10 illustrated in FIG. 1. The CCD linear sensor 13 cannot execute an intermittent charge accumulation and a signal reading operation simultaneously since the CCD linear sensor 13 functions not only as an accumulation circuit but also as a transfer circuit.

Hence, in a charge accumulation mode as depicted in FIG. 3A, signal charges obtained by the light receiving circuit 131 are accumulated in each of the CCDs in the first CCD shift register 133A and the second CCD shift register 133B; and in a subsequent signal reading mode, the signal charges accumulated in each of the CCDs in the first CCD shift register 133A and the second CCD shift register 133B are shifted in time series to thereby read out a signal voltage therefrom.

The timing control circuit 14 provides an on/off control signal, e.g., the one depicted in FIG. 3B, to the light source emitting circuit 12. The light emitting source 12 is opened to thereby emit light when the on/off control signal is 1, i.e., during an exposure period of an on-state thereof (refer to FIG. 3C); and is closed when the on/off control signal is 0, i.e., during exposure periods of an off-state thereof (refer to FIG. 3D). In the charge accumulation mode, the timing control circuit 14 provides transfer timings TG1 and TG2 (refer to FIGS. 3E and 3F) in synchronization with the on and off operations of the light emitting source 12 to the first transfer gate 132A and the second transfer gate 132B, respectively.

When the transfer timing TG1 is 1, charges generated at each photodiode 130 are fed to a corresponding CCD in the first CCD shift register 133A through the first transfer gate 132A and then accumulated therein. When the transfer timing TG2 is 1, charges generated at each photodiode 130 are fed to a corresponding CCD in the second CCD shift register 133B through the second transfer gate 132B and then accumulated therein. Through these procedures, charges obtained in each of the photodiodes of the light receiving circuit 131 in accordance with continual or intermittent exposures thereof as shown in FIGS. 3C and 3D are additionally accumulated in the first CCD shift register 133A and the second CCD shift register 133B.

As illustrated in FIG. 1, a subject 1 receives background light L1 of an artificial radiation lamp (not shown) and its reflective light L1R is inputted to the linear CCD sensor 13 through the condensing lens system 11. Further, while the light emitting source 12 is opened, emitted light L2 from the light emitting source 12 is reflected at the subject 1 and then its reflected light L2R is also inputted to the linear CCD sensor 13 through the condensing lens system 11. In this case, a part of the background light L1 may be directly fed to the linear CCD sensor 13.

Charges obtained at each photodiode 130 from the incident lights L1R and L2R are additionally accumulated at each CCD of the first CCD shift register 133A during exposure periods corresponding to an on-state of the light emitting source 12. Meanwhile, charges obtained at each photodiode 130 for the incident light L1R are additionally accumulated at each CCD of the second CCD shift register 133B during exposure periods corresponding to an off-state of the light emitting source 12.

In a signal reading mode as depicted in FIG. 3A, the timing control circuit 14 provides a signal reading timing SCK as shown in FIG. 3G to the first CCD shift register 133A and the second CCD shift register 133B. In the signal reading mode, since the first transfer gate 132A and the second transfer gate 132B do not operate, charges from the light receiving circuit 131 are not transmitted to the first CCD shift register 133A and the second CCD shift register 133B. Instead, accumulated charges in each CCD thereof are shifted one by one according to each signal reading timing SCK and accordingly fed to the differential amplifier 134. In this case, the signal reading timing SCK generally contains a plurality of, e.g., 2 to 4, clocks as shown in FIG. 3G to cause the shift registering of the accumulated charges one by one.

The differential amplifier 134 calculates and outputs a differential signal between a first signal charge additionally accumulated during the exposure periods corresponding to an on-state of the light emitting source 12 and a second signal charge additionally accumulated during the exposure periods corresponding to an off-state thereof.

Figure 4A:
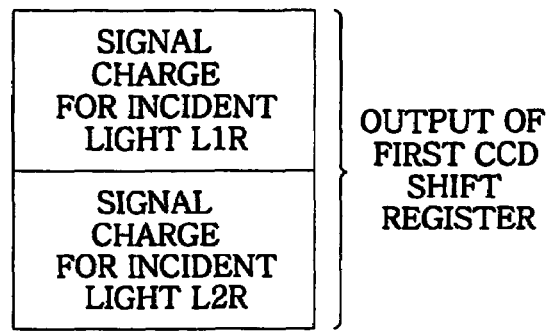
FIGS. 4A to 4C present diagrams for describing the operation of the solid state imaging apparatus illustrated in FIG. 1.
Figure 4B:
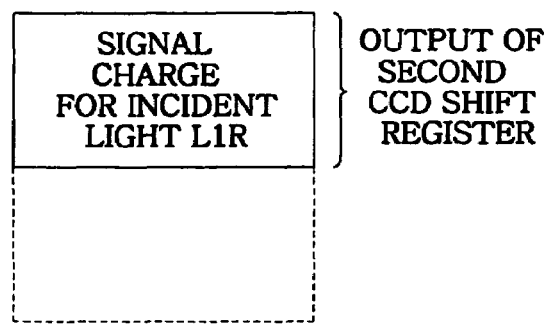
Figure 4C:
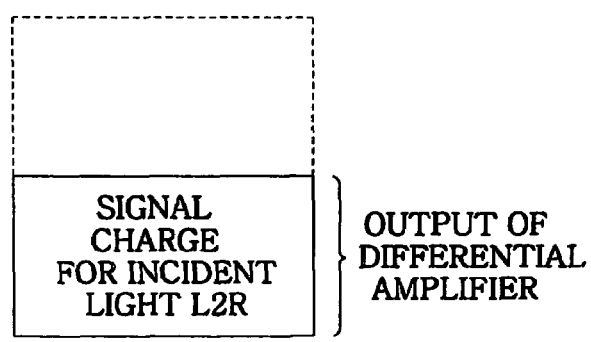

FIGS. 4A to 4C present diagrams for describing the operation of the solid state imaging apparatus 10 illustrated in FIG. 1. As illustrated in FIG. 4, since a signal charge corresponding to the incident light L1R is common to the first CCD shift register 133A and the second CCD shift register 133B, a differential signal corresponding to the incident light L2R can be obtained by the differential amplifier 134.

Accordingly, by using the solid state imaging apparatus 10, the effect due to the background light L1 is eliminated to thereby obtain a signal charge in time series corresponding to the emitted light L2 from the light emitting source 12 having a considerable light intensity. The signal processing circuit 15 performs data processing on this signal charge, i.e., the differential signal from the differential amplifier 134 in the CCD linear sensor 13 to thereby obtain a clear image of a target subject, e.g., the bar code 1, free from the backlight effect.

Figure 5:
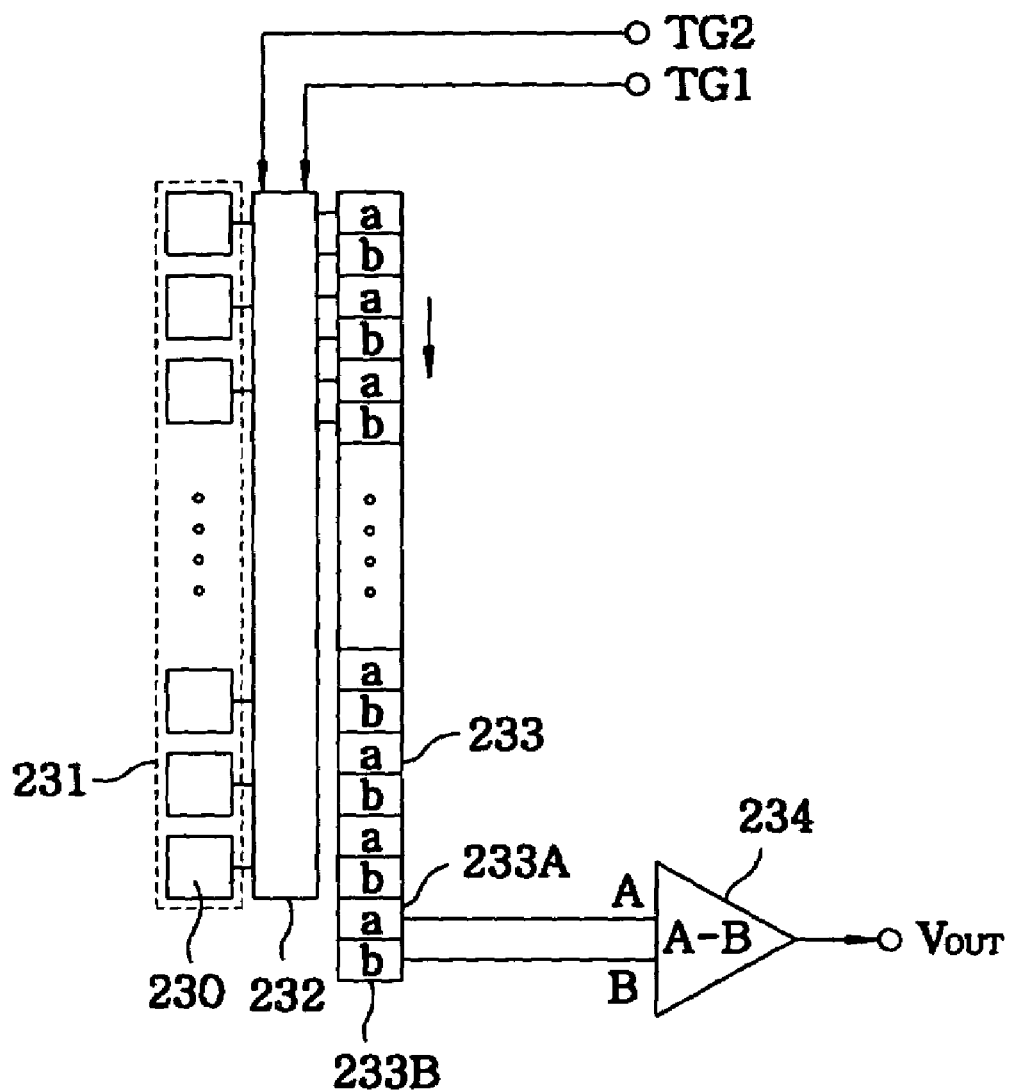
FIG. 5 sets forth a structural diagram of a CCD linear sensor in accordance with a second preferred embodiment of the present invention.
Figure 6:
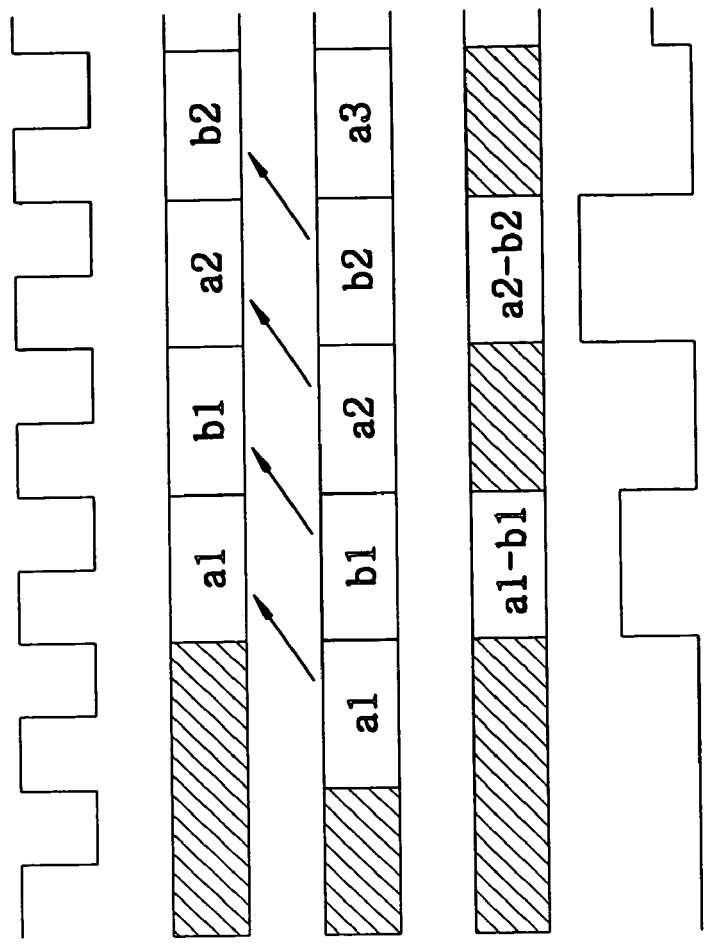
FIGS. 6A to 6E reveal timing diagrams relating to the operation of a solid state imaging apparatus equipped with the CCD linear sensor set forth in FIG. 5.

FIG. 5 sets forth a structural diagram of a CCD linear sensor 23 in accordance with a second preferred embodiment of the present invention. FIGS. 6A to 6E reveal timing diagrams relating to the operation of a solid state imaging apparatus equipped with the CCD linear sensor 23 set forth in FIG. 5.

As shown in FIG. 5, the CCD linear sensor 23 has a light receiving circuit 231 having a plurality of linearly arranged photodiodes, a transfer gate 232 and a CCD shift register 233 containing two CCDs, e.g., 233A and 233B, for one photodiode, e.g., a photodiode 230. The transfer gate 232 selectively transfers a charge from each photodiode, e.g., the photodiode 230 in the light receiving circuit 231 to one of the two CCDs, e.g., 233A and 233B. In other words, in a charge accumulation mode, in accordance with the transfer timings TG1 and TG2, charges are alternatively transferred to the two CCDs designated by "a" and "b" as illustrated in FIG. 5 and then additionally accumulated therein, respectively.

In a signal reading mode, a signal reading timing having a signal reading rate of two times that of the signal reading timing of the second preferred embodiment of the present invention is inputted to the CCD shift register 233 (refer to FIG. 6A). In response to this reading timing, charges are shifted in sequence in each CCD of the CCD shift register 233. Then output signals as shown in FIGS. 6C and 6B from a final CCD 233B and a second final CCD 233A are generated, respectively. As a result, a differential amplifier 234 provides a differential signal between the output from the CCD 233A and the output from the CCD 233B at every corresponding signal reading timing therefor. It should be noted that in the CCD linear sensor 23, since the transfer gate 232 and the CCD shift register 233 are located at a same side with respect to the light receiving circuit 231, the chip area thereof becomes advantageously small.

Figure 7:
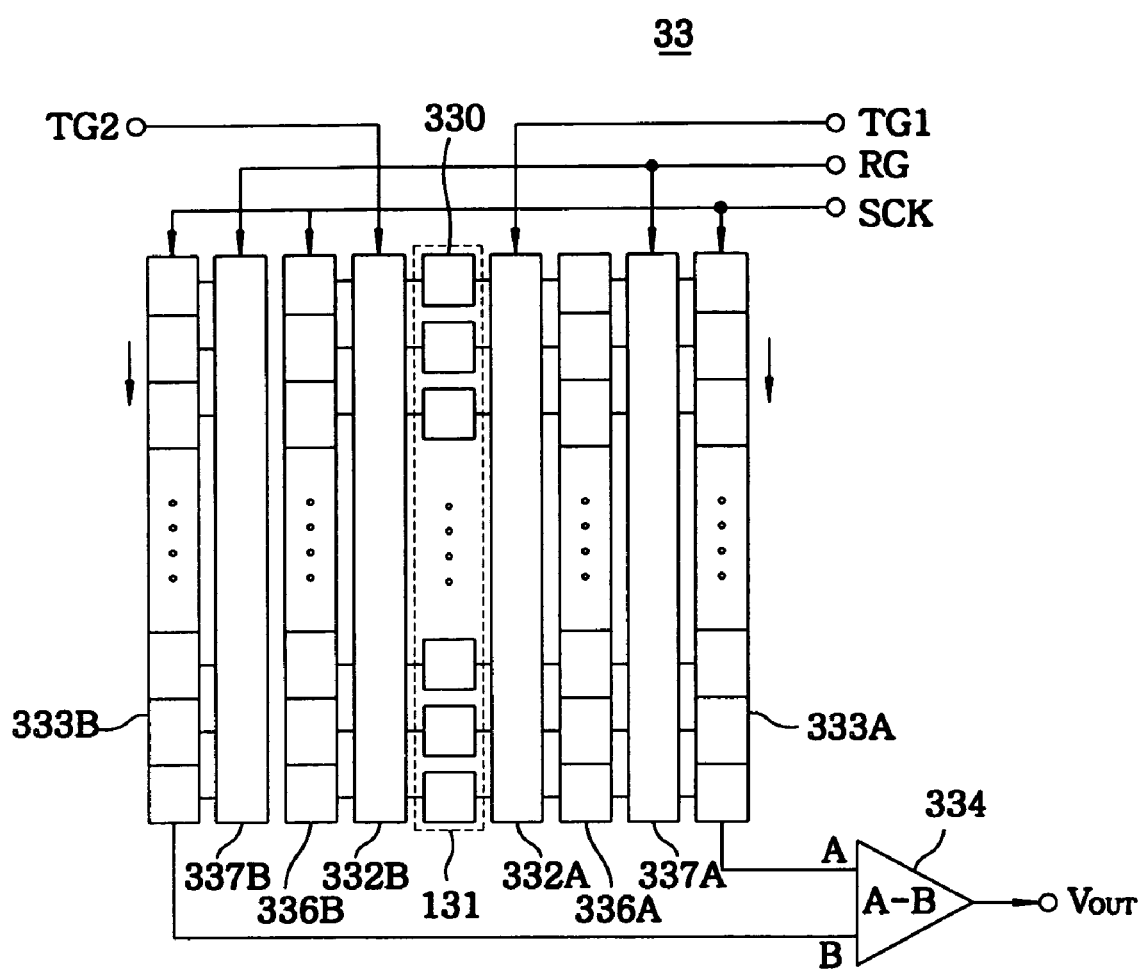
FIG. 7 charts a structural diagram of a CCD linear sensor in accordance with a third preferred embodiment of the present invention.
Figure 8:
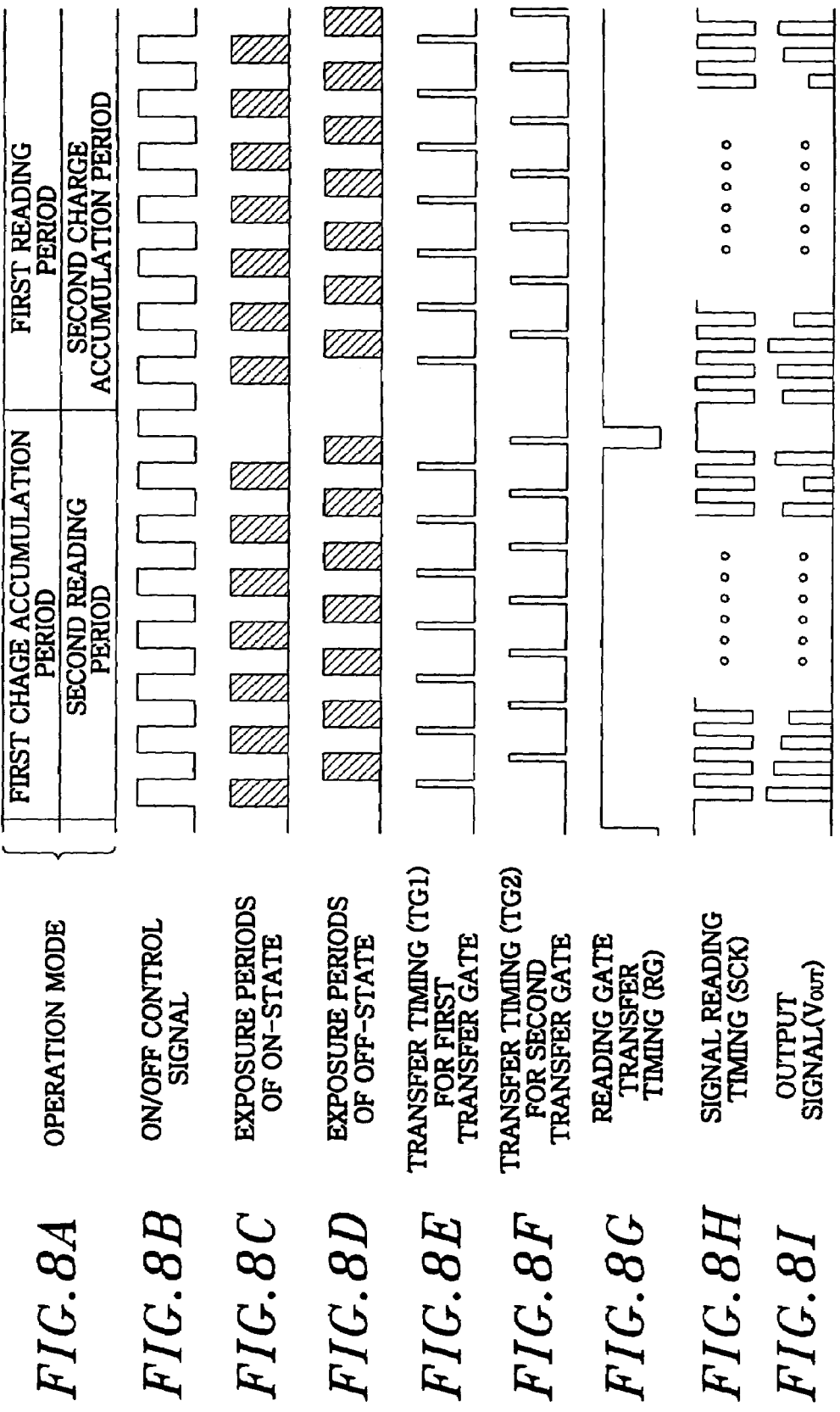
FIGS. 8A to 8I provide timing diagrams relating to the operation of a solid state imaging apparatus equipped with the CCD linear sensor shown in FIG. 7.

FIG. 7 shows a structural diagram of a CCD linear sensor 33 in accordance with a third preferred embodiment of the present invention. FIGS. 8A to 8I provide timing diagrams relating to the operation of a solid state imaging apparatus equipped with the CCD linear sensor 33 set forth in FIG. 7. In the operation of the linear sensors 13 and 23, the charge accumulation mode and the signal reading mode are performed during two different time periods. But, in the CCD linear sensor 33, to capture an image almost continuously, accumulation circuits (a first CCD register 336A and a second CCD register 336B) and transfer circuits (a first CCD shift register 333A and a second CCD shift register) are prepared independently by way of first and second signal reading gates 337A and 337B, respectively.

After charges are accumulated in the first CCD register 336A and the second CCD register 336B in accordance with an open-state and a shut-state of the light emitting source 12, respectively, the accumulated charges are transferred to the first CCD shift register 333A and the second CCD shift register 333B through the first signal reading gate 337A and the second signal reading gate 337B when a reading gate transfer timing RG is applied to the first signal reading gate 337A and the second signal reading gate 337B, respectively.

After the transmission of the accumulated charges, the first CCD register 336A and the second CCD register 336B restart to additionally accumulate charges. Meanwhile, the first CCD shift register 333A and the second CCD shift register 333B shift the charges accumulated therein in sequence in response to a corresponding signal reading timing SCK as illustrated in FIG. 8H.

By employing the solid state imaging apparatus equipped with the CCD linear sensor 33, an essential continuous image can be captured to thereby substantially reduce an unnecessary empty time interval (e.g., an interval between adjacent signal modes shown in FIG. 3A) between subsequent image captures.

Figure 9:
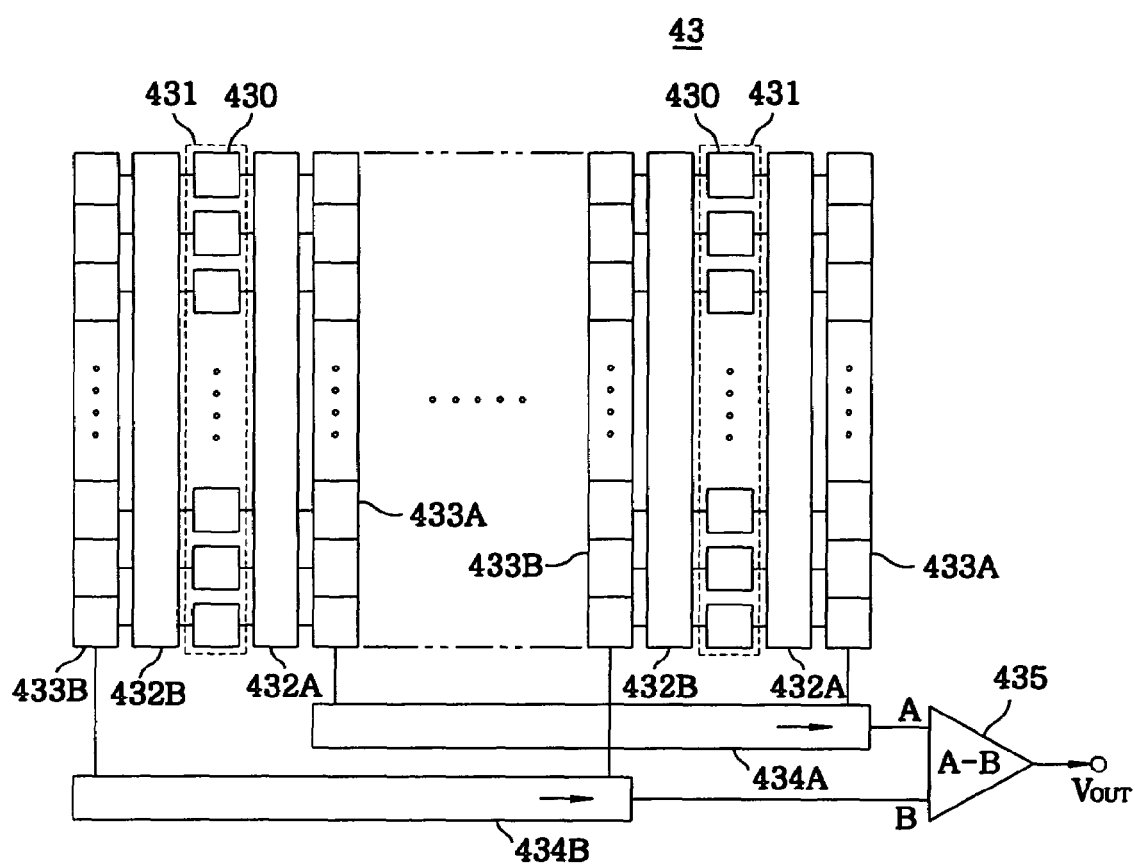
FIG. 9 represents a structural diagram of a CCD image sensor in a solid-state imaging apparatus in accordance with a fourth preferred embodiment of the present invention.

It should be noted that, in the above preferred embodiment, a linear sensor is used as a solid state imaging device included in a solid state imaging apparatus, but an image sensor can be used instead as a solid state imaging device. FIG. 9 represents a structural diagram of a CCD image sensor 43 in a solid-state imaging apparatus in accordance with a fourth preferred embodiment of the present invention. In FIG. 9, control signal lines are omitted for simplicity.

As represented in FIG. 9, the CCD linear sensor 43 has a light receiving circuit 431 containing a plurality of photodiodes 430 arranged vertically and horizontally. Similar to the structure of the linear sensor 13 depicted in FIG. 2, a first CCD shift register 433A and a second CCD shift register 433B (hereinafter referred to as vertical CCD shift registers) are vertically arranged at right and left locations of the light receiving circuit 431, respectively. A first transfer gate 432A and a second transfer gate are provided between the light receiving circuit 431 and the first vertical CCD shift register 433A and the second vertical CCD shift register, respectively, as represented in FIG. 9.

A serial output from each first vertical CCD shift register is inputted to each of the CCDs in a first horizontal CCD shift register 434A. A serial output from each second vertical CCD shift register is inputted to each of the CCDs in a second horizontal CCD shift register 434B. Outputs from the first horizontal CCD shift register 434A and the second horizontal CCD shift register 434B are fed to first and second input ports of a differential amplifier 435, respectively.

The structures and functions of the light receiving circuit 431, the first transfer gate 432A and the second transfer gate 432B, the first vertical CCD shift register 433A and the second vertical CCD shift register 433B in the image sensor 43 are the same as those of corresponding circuits in the CCD linear sensor 13, respectively.

Specifically, in a charge accumulation mode, charges obtained at each photodiode 430 during exposure times corresponding to an on-state and an off-state of a light emitting source (not shown) in the image sensor 43 are fed to corresponding CCDs in the first vertical CCD shift register 433A and the second vertical CCD shift register 433B through the first transfer gate 432A and the second transfer gate 432B, respectively.

In a signal reading mode, in response to a signal reading timing, charges accumulated in each of the CCDs in the first vertical CCD shift register 433A and the second vertical CCD shift register 433B are fed to the first horizontal CCD shift register and the second horizontal CCD shift register 434B, respectively. Charges additionally accumulated in the first horizontal CCD shift register 434A and the second horizontal CCD shift register 434B are fed to the first and the second input ports of the differential amplifier 435, respectively. The differential amplifier 435 outputs a differential signal charge between the first signal charge and the second signal charge in time series.

Figure 11A:
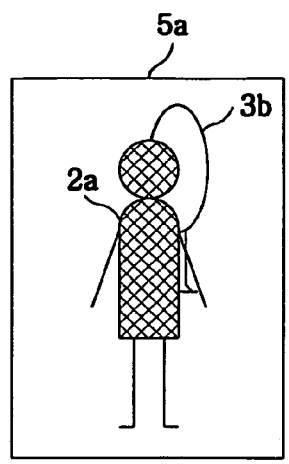
FIGS. 11A to 11C describe a situation of imaging a picture by employing the camera presented in FIG. 10.
Figure 11B:
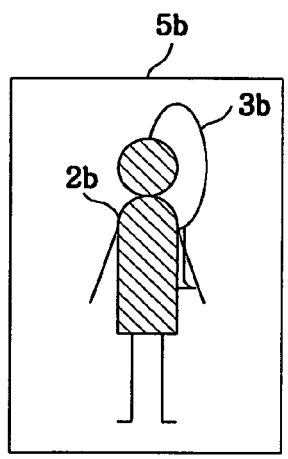
Figure 11C:
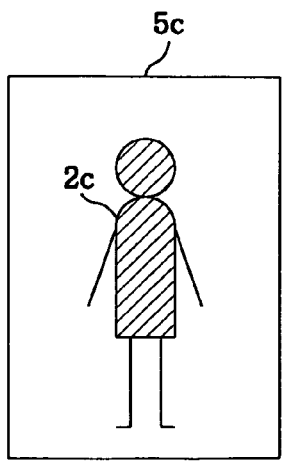

FIG. 10 offers a diagram of a camera having a solid state imaging apparatus 40 equipped with the CCD image sensor 43 represented in FIG. 9. FIGS. 11A to 11C provide schematic diagrams explaining a situation of imaging a picture by employing the camera presented in FIG. 10. The structure of the camera is basically the same as that of the bar code reader 100 in FIG. 1. An image processing circuit 45 of the camera processes a pixel signal obtained by using the solid state imaging apparatus 40 to thereby form an image. FIGS. 11A and 11B illustrate exemplary pictures 5a and 5b based on signal charges obtained during corresponding periods of an on-state and an off-state of a light emitting source, respectively. It should be noted that these images are not outputted in a real situation.

Referring to FIG. 10, since the travel distance of light from the light emitting source 42 is relatively short, the light therefrom cannot reach a far background object 3 with a considerable intensity while the light therefrom can reach a near target subject 2. As a result, the reflected light L2R from the target subject 2 during the on-state of the light emitting source 42 is substantially different from that during the off-state thereof. For this reason, referring back to FIGS. 11A to 11C, in a picture 5c obtained based on an output signal from a CCD image sensor 43, a clear image for the target subject 2 can be captured without an image interface 3b of the background object 3.

Figure 12:
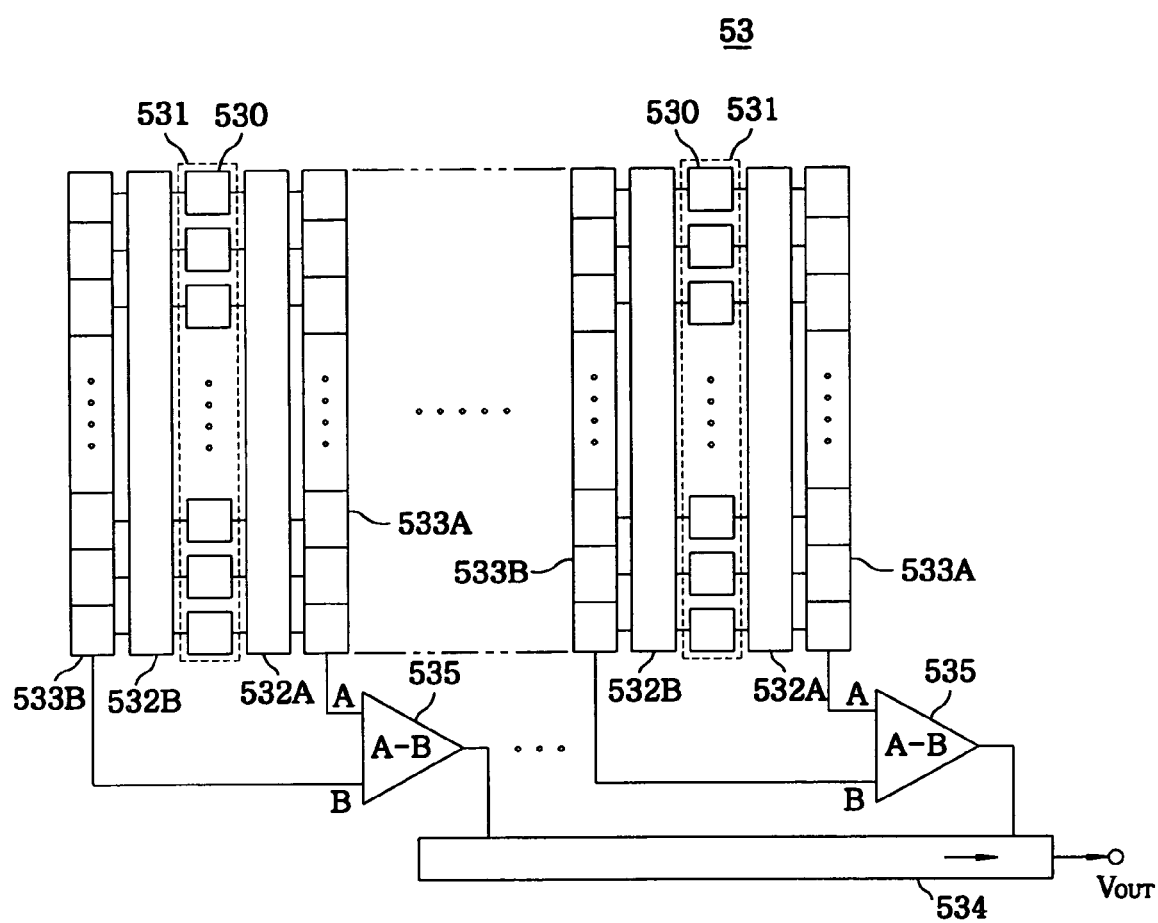
FIG. 12 pictorializes a CCD image sensor in a solid-state imaging apparatus in accordance with a fifth preferred embodiment of the present invention.
Figure 13:
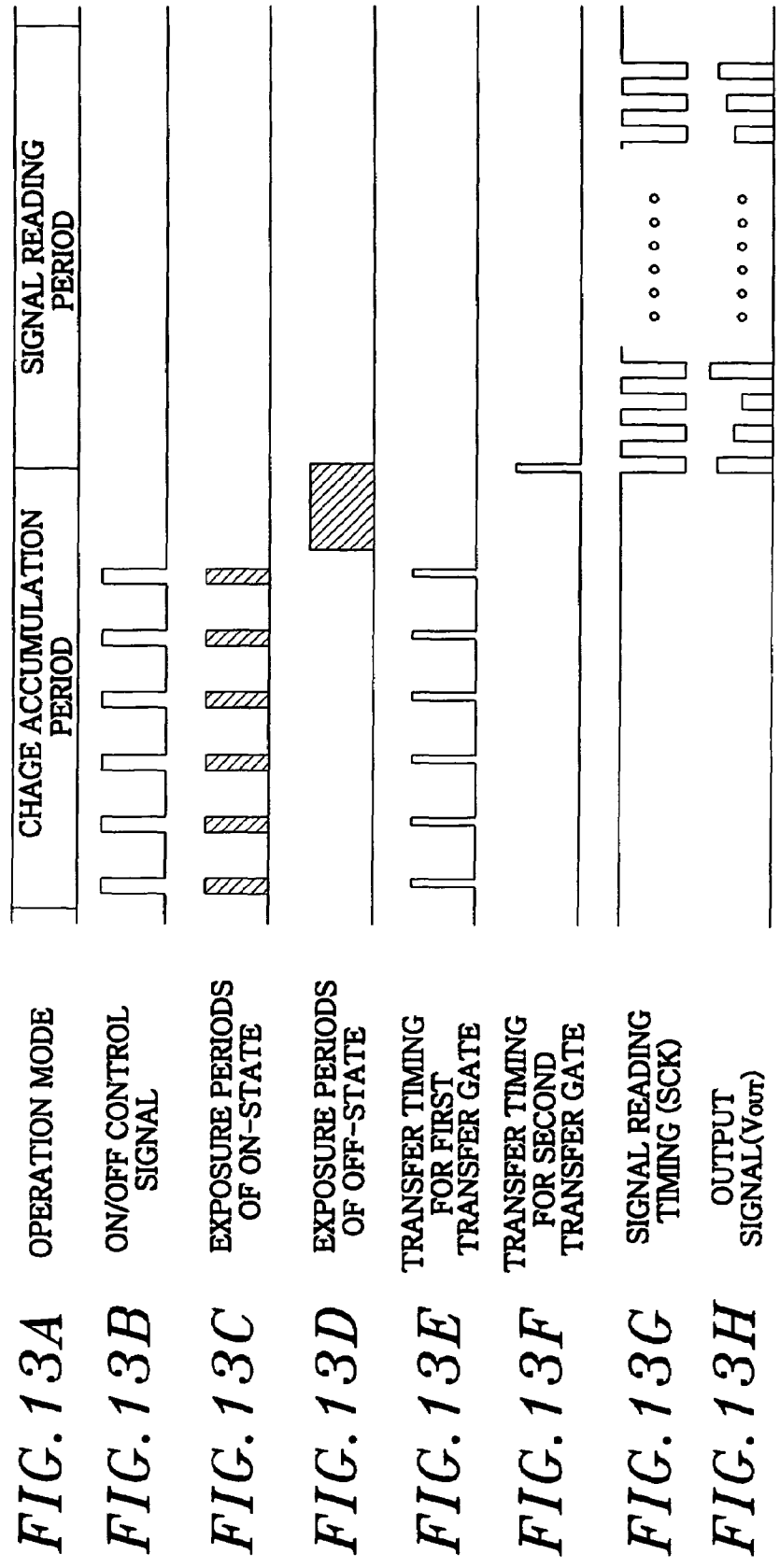
FIGS. 13A to 13H demonstrate exposure operations of a solid state imaging apparatus in accordance with a seventh preferred embodiment of the present invention.
Figure 14:
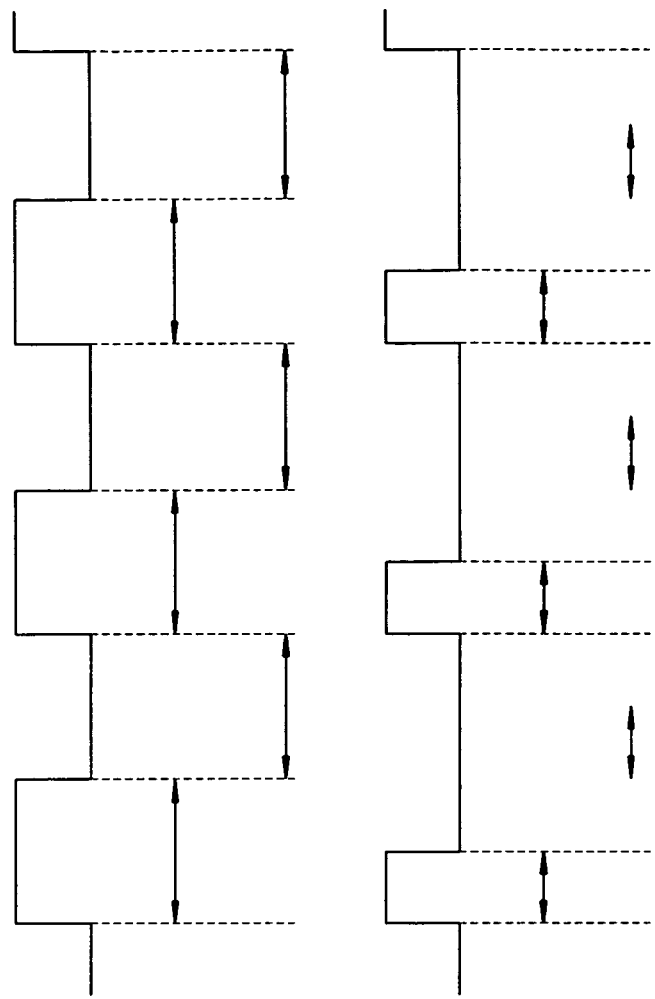
FIGS. 14A to 14F exhibit timing diagrams relating to cases that duty ratios for the on-state of a light emitting source are 25% and 50% in accordance with a sixth preferred embodiment of the present invention.

It should be noted that various modifications of the CCD image sensor 43 are possible as in the case of the CCD linear sensor 13. FIG. 12 describes a diagram of a modified CCD image sensor in accordance with a fifth preferred embodiment of the present invention. In FIG. 12, one differential amplifier 535 is provided for a pair of two vertical lines, i.e., a first CCD shift register 533A and a second CCD shift register 533B. An output voltage from each differential amplifier 535 is outputted at a horizontal CCD shift register 534 in sequence. It should be noted that those who skilled in the art can easily utilize the CCD linear sensor shown in FIG. 5 or FIG. 7 as the modified CCD image sensor.

In the solid state imaging apparatus 10 shown in FIG. 1, the image for the target subject 1 is getting clearer as the intensity of the light from the light emitting source 12 increases. The light emitting intensity thereof becomes strong as a corresponding input power increases. But there is a limitation in increasing the corresponding input power per a preset unit time when a light-emitting diode (LED) or semiconductor laser is utilized as the light emitting source 12.

Namely, within the preset unit time, the light intensity should be decreased if the light emitting time is increased. In the above-mentioned first to fifth preferred embodiments, a duty ratio for on-state of each of the light emitting sources 12 and 42 has been set as 50%. But, if this duty ratio for the on-state thereof becomes less than 50%, i.e., if the on-state becomes shorter than the off-state thereof, the light emitting intensity during the on-state can be increased.

FIGS. 14A to 14F exhibit timing diagrams relating to cases when duty ratios for the on-state of a light emitting source are 50% (refer to FIGS. 14A and 14C) and 25% (refer to FIGS. 14D and 14F), respectively, in accordance with a sixth preferred embodiment of the present invention. As shown in FIG. 14A, when the duty ratio thereof is 50%, it is desirable that the exposure be fully maintained during the time interval corresponding to each of the on-state and off-state thereof.

When the duty ratio thereof is 25% as exhibited in FIG. 14D, it is desirable that the exposure be fully maintained during the time interval corresponding to the on-state thereof while the exposure is maintained during only a part of the time interval corresponding to the off-state thereof. When the duty ratio is small, e.g., 25%, it is desirable to increase the light emitting intensity. By increasing the light emitting intensity, during the exposure time of the on-state thereof, a ratio between the charge amount corresponding to the radiation light and the charge amount corresponding to the background light can be relatively large. Hence, in this case, if the effect due to the background light is regarded as a noise, a signal to noise (S/N) ratio thereof is improved.

In each of the above-mentioned preferred embodiments, an exposure during an on-state thereof and that during an off-state thereof are executed alternatively. FIGS. 13A to 13H demonstrate exposure operations in accordance with a seventh preferred embodiment of the present invention. The exposure during an off-state thereof is not necessarily executed continually but can be performed en bloc (refer to FIG. 13D) while the exposure during an on-state thereof is needed to be executed continually as illustrated in FIG. 13C.

In detail, during a charge accumulation period, on/off operations are repeated continually within the accumulation period (refer to FIGS. 13A and 13B) and then charges obtained during on-states thereof are additionally accumulated (refer to FIGS. 13C and 13E). Thereafter, the exposure operation during an exposure time period within the off-state thereof is performed (refer to FIGS. 13D and 13F). In this case, the total exposure time during the on-state thereof is designed to be substantially equal to the exposure time during the off-state thereof.

Generally, a light receiving device or a CCD is formed on a one semiconductor chip to obtain a required property. Since, however, there may be a property difference among the light receiving devices, even when the exposure time during the on-state thereof is equal to that during the off-state thereof, signal charges due to the background light for the first and the second CCD shift register (e.g., signal charges due to the background light L1R in FIG. 4) may be different from each other.

In this case, in an output signal from a corresponding differential amplifier, a signal due to the background light is not fully cancelled to thereby rendering it difficult to delineate between the background object and the target subject. For this reason, therefore, it is needed that the exposure time during the off-state thereof be a little bit (e.g., over a number of percents) longer than that during the on-state thereof. With this method, the effect due to the background light can be fully cancelled even when the efficiency thereof during the on-state is a little bit higher than that during the off-state.

In accordance with the fourth preferred embodiment of the present invention, in addition to obtaining a differential signal between accumulated charges during the on-state and those during the off-state thereof, capturing an image with the backlight effect is also possible.

For example, in FIG. 2, if a transfer timing TG2 is not inputted therein or the differential amplifier is controlled to be operated in an additional operation to render the accumulated charge during the off-state to be zero, an image capture with the backlight effect is also possible.

In each of the solid state imaging apparatuses shown in FIGS. 1 and 9, if the light emitting source is a white light source, black-and-white image data are obtained by using the CCD linear sensor or the CCD image sensor in accordance with the present invention. If the light emitting source is a monochromatic light source, e.g., a red or blue light source, corresponding colored reflective image data are obtained.

Therefore, in accordance with the present invention, the solid state imaging apparatus to obtain colored image data can be prepared by employing appropriate charge accumulation circuits and transfer circuits corresponding to the three primary lights, i.e., red, blue and green light. In detail, there are two methods to obtain colored image data. From now on, these two methods applied on the solid state imaging apparatus will be described.

In a first method, the light emitting source 12 is prepared to have three colored light emitting elements, e.g., LEDs, to emit red, blue and green light, respectively; and for one light receiving circuit 131, a set of three CCD shift registers are prepared to accumulate charges when each of the colored light elements is opened and shut, respectively.

Three colored light emitting elements are opened, i.e., turned on, in sequence and then a corresponding CCD shift register for each colored light emitting element additionally accumulates charges while a corresponding colored light emitting element is under the on-state thereof and another corresponding CCD shift register for each colored light emitting element accumulates charges additionally while all the colored light emitting elements are under the off-state thereof. As a result, for each of the three colored lights, there is obtained a differential signal between charges accumulated during the on-state and those during the off-state thereof.

In this case, the white balance controlling therefor can be preferably performed by accommodating a driving current or an exposure time for each colored light emitting element. The charge obtained during the off-state thereof can be commonly utilized in obtaining a differential signal of accumulated charges for each colored light regardless of the kind of colored lights. Hence, three CCD shift registers for charge accumulation corresponding to one exposure time period may be sequentially connected to the light receiving circuit 131. An accumulated charge in one CCD shift register corresponding to one exposure time period may be commonly employed to obtain a corresponding differential signal for each of the colored lights.

In a second method, CCDs equipped with color filters are used. Three primary light emitting elements, i.e., red, blue and green light emitting elements, or a white light emitting source having the three primary light emitting elements may be prepared as the light emitting source 12. During an exposure time of an on-state for this kind of light emitting source, the light receiving circuit 131 receives the light emitted from the light emitting source 12 and then transfers charges generated therein to the CCD shift registers equipped with color filters prepared corresponding to the colored lights, respectively.

In this case, contrary to the first method, the exposure thereof can be executed simultaneously and the white balance controlling thereof can be preferably performed by accommodating a temperature of a corresponding colored light emitting element. For example, obtaining white light through the combination of three primary lights is possible by accommodating a driving current or an exposure time for each corresponding LED.

Further, to read characters in a picture (e.g., a picture of a license plate of a car), full color image is not necessarily needed. For example, in this case, through the combination process employing at least two light emitting elements having different wave lengths as described above, information for two or more colors thereof can be interpreted to thereby obtain a corresponding color picture image as well as luminance information therefor. This method is advantageously utilized to enhance the image processing efficiency.

As an example of an application of a solid state imaging apparatus of the present invention, there is a reading device of a license plate of a car. When an image for a license plate of a car is considerably dark with respect to the main body or a light emitting source such as a headlight thereof, a conventional solid state imaging apparatus cannot obtain a sufficiently clear image to discriminate characters in the license plate since the exposure controlling in the conventional solid state imaging apparatus is performed only to reduce the exposure amount thereof.

On the other hand, in the solid state imaging apparatus in accordance with the present invention, the radiation of the light emitting source can be controlled in such a way that it can be prevented from overflowing when the background light intensity reaches a maximum value to thereby suppress the generation of a shadow for the license plate.

Accordingly, a clear image of a license plate of a car can be obtained by reducing or eliminating the influence due to natural sunlight and/or headlight of the car to thereby greatly reduce the likelihood of misreading of the license plate. The solid state imaging apparatus of the present invention can be utilized in other applications. For example, exposure timing can be controlled in synchronization with pictures having periodical characteristics such as a picture of a television signal to thereby extract desired pictures.

An auto-focusing circuit equipped with a pint detection device employing a CCD sensor in a conventional one-eyed reflex camera cannot focus a target subject image on a white wall. But, by using the solid state imaging apparatus of the present invention, the effect due to a backlight can be cancelled to thereby focus a target subject image on a white wall satisfactorily even when the reflective light is strong.

Figure 15:
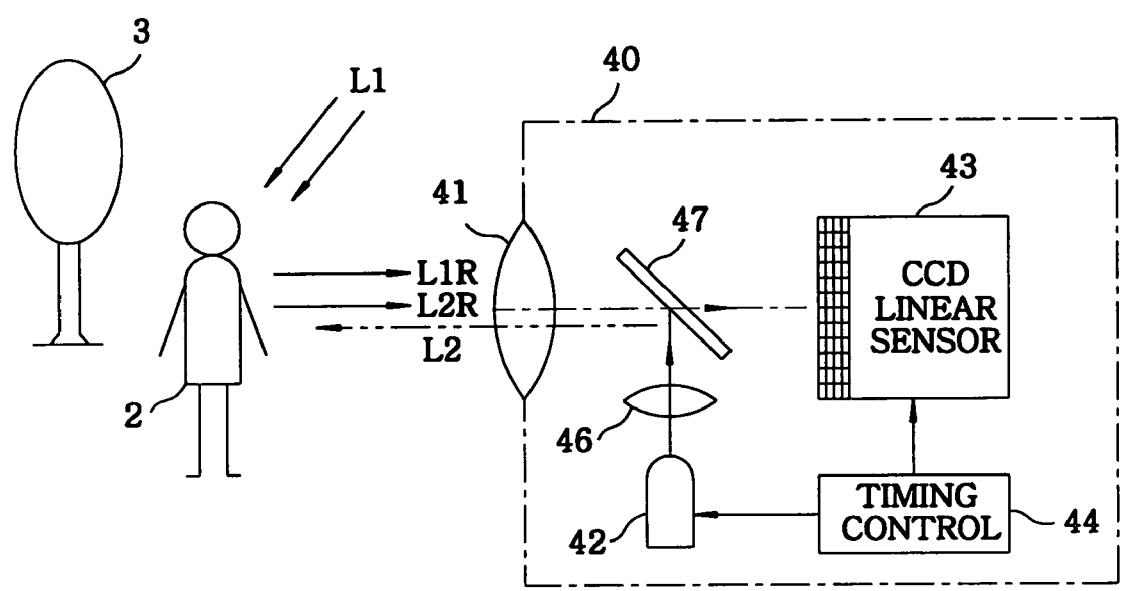
FIG. 15 displays an optical system in a solid state imaging apparatus in accordance with an eighth preferred embodiment of the present invention.

FIG. 15 displays a modified optical system in a solid state imaging apparatus in accordance with an eighth preferred embodiment of the present invention. In this modified optical system, by employing a half mirror 47, the lens 41 functions not only as a lens to receive light from outside and then focus the light to the CCD image sensor 43, but also as a lens through which the light passes from the light emitting source 42 onto a target subject 2. With this configuration, since the radiation onto the target subject 2 and reception of the light therefrom is performed along an almost same line as shown in FIG. 15, a clear image of the target subject 2 can be advantageously obtained without a shadow image thereof.

In view of the foregoing, by employing a solid state imaging device and a solid state imaging apparatus in accordance with the present invention, the effect due to a background light from a background object can be greatly reduced or removed to thereby obtain a clear image of a target subject. Accordingly, by using the solid state imaging device and the solid state imaging apparatus of the present invention, the discriminative image capturing capability for a target subject can be greatly enhanced.

While the present invention has been described with respect to certain preferred embodiments only, other modifications and variations may be made without departing from the scope and spirit of the present invention as set forth in the following claims.

What is claimed is:

1. A solid state imaging apparatus comprising:
    means for receiving an incident light to thereby generate charges, the receiving means having one or more photoelectric conversion elements;
    first accumulation means, in response to a first control signal, for accumulating the charges generated at each of the photoelectric conversion elements, the first accumulation means having one or more charge accumulation devices;
    second accumulation means, in response to a second control signal, for accumulating the received charges generated from each of the photoelectric conversion elements, the second accumulation means having one or more charge accumulation devices;
    first transfer means for transferring the charges accumulated in the first charge accumulation means in a serial sequence as a first charge signal;
    second transfer means for transferring charges accumulated in the second charge accumulation means in a serial sequence as a second charge signal,
    means for emitting light onto a target subject, wherein the intensity of the emitting light is controllable;
    control means, based on a variation of the intensity of the emitted light, for outputting the first control signal or the second control signal to select the first or second charge accumulation means, thereby allowing the charges to be accumulated in the first or the second charge accumulation means, respectively; and
    means for calculating a difference between the first charge signal and the second charge signal to thereby output a differential signal in sequence.

2. The solid state imaging apparatus of claim 1, wherein each charge accumulation device in the first accumulation means and the second accumulation means is prepared for each corresponding photoelectric conversion element.

3. The solid state imaging apparatus of claim 1, wherein said light emitting means is operated either in an on-state or in an off-state thereof; and said control means outputs the first control signal and the second control signal during the on-state and the off-state of said light emitting means, respectively.

4. The solid state imaging apparatus of claim 1, wherein the charges accumulated in the first and the second accumulation means are fed en bloc to the first and the second transfer means, respectively; the first and the second transfer means transfer the charges in series; and at the same time, the first and the second accumulation means accumulate the charges.

5. The solid sate imaging apparatus of claim 3, wherein the first accumulation means additionally accumulates charges obtained during a continued on-state of the light emitting means and then transfers the obtained charges.

6. A solid state imaging apparatus comprising:
    means having one or more photoelectric conversion elements for receiving an incident light and then generating charges;
    first accumulation means having one or more charge accumulation devices, in response to a first control signal, for accumulating the charges generated at each of the photoelectric conversion elements and then transferring the accumulated charges in a serial sequence as a first charge signal;
    second accumulation means having one or more charge accumulation devices, in response to a second control signal, for accumulating the received charges generated at each of the photoelectric conversion elements and then transferring the accumulated charges in a serial sequence as a first charge signal;
    means for emitting light onto a target subject, the intensity of the light being controlled to be varied;
    control means, based on a variation of intensity of the emitted light, for outputting the first control signal or the second control signal to select the first or the second charge accumulation means, thereby allowing the charges to be accumulated in the first or the second charge accumulation means, respectively; and means for calculating a difference between the first charge signal and the second charge signal to thereby output a differential signal in sequence, wherein in each of the first and the second accumulation means, the charge accumulation operation and the transfer operation are performed during different time periods from each other.

* * * * *